(12) United States Patent
Okuno et al.

(10) Patent No.: US 12,227,836 B2
(45) Date of Patent: Feb. 18, 2025

(54) CUTTING TOOL

(71) Applicant: Sumitomo Electric Hardmetal Corp., Itami (JP)

(72) Inventors: Susumu Okuno, Itami (JP); Yasuki Kido, Itami (JP); Fumiyoshi Kobayashi, Itami (JP); Anongsack Paseuth, Itami (JP)

(73) Assignee: SUMITOMO ELECTRIC HARDMETAL CORP., Itami (JP)

(*) Notice: Subject to any disclaimer, the term of this patent is extended or adjusted under 35 U.S.C. 154(b) by 566 days.

(21) Appl. No.: 17/616,679

(22) PCT Filed: Apr. 10, 2020

(86) PCT No.: PCT/JP2020/016106
§ 371 (c)(1),
(2) Date: Dec. 6, 2021

(87) PCT Pub. No.: WO2021/205645
PCT Pub. Date: Oct. 14, 2021

(65) Prior Publication Data
US 2022/0331880 A1 Oct. 20, 2022

(51) Int. Cl.
C23C 28/04 (2006.01)
C23C 16/36 (2006.01)
C23C 16/40 (2006.01)

(52) U.S. Cl.
CPC ............ *C23C 16/403* (2013.01); *C23C 16/36* (2013.01); *C23C 28/044* (2013.01)

(58) Field of Classification Search
None
See application file for complete search history.

(56) References Cited

U.S. PATENT DOCUMENTS 11,207,736 B2 * 12/2021 Okuno ................ C23C 16/029
2014/0227547 A1 8/2014 Ri
(Continued)

FOREIGN PATENT DOCUMENTS

CN 103171178 A 6/2013
EP 1 997 938 A2 12/2008
(Continued)

*Primary Examiner* — Kim S. Horger
(74) *Attorney, Agent, or Firm* — XSENSUS LLP

(57) ABSTRACT

Provided is a cutting tool including a base material and a coating layer provided on the base material, the coating layer including a titanium carbonitride layer provided on the base material, an intermediate layer provided on the titanium carbonitride layer in contact therewith, and an alumina layer provided on the intermediate layer in contact therewith, the intermediate layer being composed of a compound made of titanium, carbon, oxygen, and nitrogen, the intermediate layer having a thickness of more than 1 μm, when $P_{C1}$ atomic % represents an atomic ratio of the carbon in an interface between the intermediate layer and the alumina layer, and $P_{C2}$ atomic % represents an atomic ratio of the carbon at a point A away from the interface by 1 μm on a side of the intermediate layer, a ratio $P_{C1}/P_{C2}$ of the $P_{C1}$ to the $P_{C2}$ being more than or equal to 1.03.

16 Claims, 7 Drawing Sheets

(56) References Cited

U.S. PATENT DOCUMENTS

| | | | |
|---|---|---|---|
| 2017/0191169 | A1 | 7/2017 | Imamura et al. |
| 2018/0369926 | A1* | 12/2018 | Kodama ............... B23B 27/148 |
| 2019/0039148 | A1* | 2/2019 | Kubo ..................... C23C 28/04 |
| 2019/0076934 | A1 | 3/2019 | Satoh et al. |

FOREIGN PATENT DOCUMENTS

| | | |
|---|---|---|
| EP | 2 692 467 A1 | 2/2014 |
| JP | 9-174304 A | 7/1997 |
| JP | 11-347806 A | 12/1999 |
| JP | 2009-166216 A | 7/2009 |
| JP | 2019-51565 A | 4/2019 |
| JP | 2019-171483 A | 10/2019 |
| WO | 2013/031458 A1 | 3/2013 |
| WO | 2017/037797 A1 | 3/2017 |

* cited by examiner

CUTTING TOOL

CROSS-REFERENCE TO RELATED APPLICATION

The present application is based on PCT filing PCT/JP2020/016106, filed Apr. 10, 2020, the entire contents of which are incorporated herein by reference.

TECHNICAL FIELD

The present disclosure relates to a cutting tool.

BACKGROUND ART

Conventionally, cutting tools including a base material coated thereon with a coating film have been used. For example, Japanese Patent Laying-Open No. 09-174304 (PTL 1) discloses a surface-coated cemented carbide cutting tool having an excellent chipping resistance, including a hard coating layer formed with an average layer thickness of 5 to 20 μm on a surface of a tungsten carbide-based cemented carbide base body, the hard coating layer including an inner layer, an intermediate layer, and an outer layer, the inner layer being made of a single layer of one of or multiple layers of two or more of a titanium carbide layer, a titanium nitride layer, and a titanium carbonitride layer, the intermediate layer being made of a titanium carboxide layer and/or a titanium carbonitroxide layer, the outer layer being made of an aluminum oxide layer, wherein an interface portion with the aluminum oxide layer as the outer layer in the intermediate layer has a sharpened needle-like crystal structure.

In addition, Japanese Patent Laying-Open No. 2009-166216 (PTL 2) discloses a coated tool including a film formed on a surface of a base body, the film being a single-layer film of any one of or a multilayer film of two or more of a carbide, a nitride, a carbonitride, an oxide, a carboxide, a nitroxide, and a carbonitroxide of an element selected from metals of groups 4a, 5a, and 6a of the periodic table, the coated tool further including an α-type aluminum oxide film formed on the film with a bonding film being interposed therebetween, wherein a surface shape of the bonding film in an interface between the bonding film and the α-type aluminum oxide film has a tree branch shape including a tree-like projection and a branch-like projection continuous thereto, when the branch-like projection has a length LB (nm), LB satisfies 5≤LB≤200, and an interface between the branch-like projection and the α-type aluminum oxide film has a continuous check pattern through observation with a transmission electron microscope.

CITATION LIST

Patent Literature

PTL 1: Japanese Patent Laying-Open No. 09-174304
PTL 2: Japanese Patent Laying-Open No. 2009-166216

SUMMARY OF INVENTION

A cutting tool in accordance with the present disclosure is a cutting tool including a base material and a coating layer provided on the base material,
the coating layer including a titanium carbonitride layer provided on the base material, an intermediate layer provided on the titanium carbonitride layer in contact therewith, and an alumina layer provided on the intermediate layer in contact therewith,
the intermediate layer being composed of a compound made of titanium, carbon, oxygen, and nitrogen,
the intermediate layer having a thickness of more than 1 μm,
when $P_{C1}$ atomic % represents an atomic ratio of the carbon in an interface between the intermediate layer and the alumina layer, and $P_{C2}$ atomic % represents an atomic ratio of the carbon at a point A away from the interface by 1 μm on a side of the intermediate layer, a ratio $P_{C1}/P_{C2}$ of the $P_{C1}$ to the $P_{C2}$ being more than or equal to 1.03.

DETAILED DESCRIPTION

Figure 1:
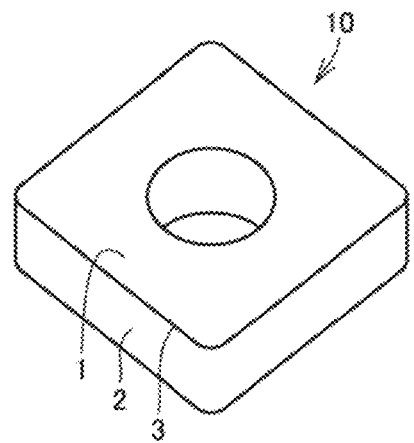
FIG. 1 is a perspective view illustrating one aspect of a base material of a cutting tool.

Problem to be Solved by the Present Disclosure

In PTL 1 and PTL 2, it is expected that adhesiveness between the aluminum oxide layer and another layer in contact with the aluminum oxide layer is improved, and thus the cutting tool has a longer life, by having a coating film with a configuration as described above.

However, in cutting processing in recent years, there has been a tendency that further increase in speed and efficiency is promoted, a load imposed on a cutting tool is increased, and thereby the cutting tool has a shorter life. Accordingly, further improvement in mechanical characteristics (for example, peel resistance, wear resistance, chipping resistance, and the like) of a coating film of the cutting tool is required.

The present disclosure has been made in view of the aforementioned circumstances, and an object thereof is to provide a cutting tool having an improved chipping resistance.

Advantageous Effect of the Present Disclosure

According to the present disclosure, a cutting tool having an improved chipping resistance can be provided.

DESCRIPTION OF EMBODIMENT OF THE PRESENT DISCLOSURE

First, aspects of the present disclosure will be described in list form.

[1] A cutting tool in accordance with the present disclosure is
a cutting tool including a base material and a coating layer provided on the base material,
the coating layer including a titanium carbonitride layer provided on the base material, an intermediate layer provided on the titanium carbonitride layer in contact therewith, and an alumina layer provided on the intermediate layer in contact therewith,
the intermediate layer being composed of a compound made of titanium, carbon, oxygen, and nitrogen,
the intermediate layer having a thickness of more than 1 µm,
when $P_{C1}$ atomic % represents an atomic ratio of the carbon in an interface between the intermediate layer and the alumina layer, and $P_{C2}$ atomic % represents an atomic ratio of the carbon at a point A away from the interface by 1 µm on a side of the intermediate layer, a ratio $P_{C1}/P_{C2}$ of the $P_{C1}$ to the $P_{C2}$ being more than or equal to 1.03.

By including a configuration as described above, the cutting tool has an improved chipping resistance. Here, "chipping resistance" means resistance to minute chipping occurring in a coating film including the coating layer when the cutting tool is used for cutting processing.

[2] The $P_{C1}$ is preferably more than or equal to 25 atomic % and less than or equal to 65 atomic %. By such a definition, chipping resistance is further improved.

[3] When $P_{N1}$ atomic % represents an atomic ratio of the nitrogen in the interface, and $P_{N2}$ atomic % represents an atomic ratio of the nitrogen at the point A, a ratio $P_{N1}/P_{N2}$ of the $P_{N1}$ to the $P_{N2}$ is preferably more than or equal to 0.9 and less than 1. By such a definition, peel resistance of the alumina layer is improved, in addition to chipping resistance. Here, "peel resistance of the alumina layer" means resistance to peeling-off of the alumina layer from the intermediate layer of the cutting tool when the cutting tool is used for cutting processing.

[4] When $P_{O1}$ atomic % represents an atomic ratio of the oxygen in the interface, and $P_{O2}$ atomic % represents an atomic ratio of the oxygen at the point A, a ratio $P_{O1}/P_{O2}$ of the $P_{O1}$ to the $P_{O2}$ is preferably more than or equal to 0.9 and less than 1. By such a definition, wear resistance is improved, in addition to chipping resistance. Here, "wear resistance" means resistance to wear of the coating film including the coating layer when the cutting tool is used for cutting processing.

[5] Preferably, the intermediate layer has a thickness of more than 1 µm and less than or equal to 3 µm. By such a definition, chipping resistance is further improved.

[6] Preferably, an underlying layer is further provided between the base material and the coating layer. By such a definition, adhesiveness between the base material and the coating layer is improved, in addition to chipping resistance.

[7] Preferably, a surface layer is further provided on the coating layer. By such a definition, it is possible to provide a cutting tool excellent in wear resistance in addition to chipping resistance.

DETAILS OF EMBODIMENT OF THE PRESENT DISCLOSURE

One embodiment of the present disclosure (hereinafter referred to as the "present embodiment") will be described below, although the present embodiment is not limited thereto. In the present specification, an expression in the form of "X to Z" means lower and upper limits of a range (that is, more than or equal to X and less than or equal to Z), and when X is not accompanied by any unit and Z is alone accompanied by a unit, X has the same unit as Z. Further, in the present specification, when a compound is represented by a chemical formula in which composition ratios of constituent elements are unspecified, such as "TiC", for example, the chemical formula shall include any conventionally known composition ratio (element ratio). On this occasion, the above chemical formula shall include not only a stoichiometric composition but also a non-stoichiometric composition. For example, the chemical formula "TiC" includes not only a stoichiometric composition "$Ti_1C_1$" but also a non-stoichiometric composition such as "$Ti_1C_{0.8}$", for example. The same applies to the description of compounds other than "TiC".

<<Cutting Tool>>

A cutting tool in accordance with the present disclosure is
a cutting tool including a base material and a coating layer provided on the base material,
the coating layer including a titanium carbonitride layer provided on the base material, an intermediate layer provided on the titanium carbonitride layer in contact therewith, and an alumina layer provided on the intermediate layer in contact therewith,
the intermediate layer being composed of a compound made of titanium, carbon, oxygen, and nitrogen,
the intermediate layer having a thickness of more than 1 µm,
when $P_{C1}$ atomic % represents an atomic ratio of the carbon in an interface between the intermediate layer and the alumina layer, and $P_{C2}$ atomic % represents an atomic ratio of the carbon at a point A away from the interface by 1 µm on a side of the intermediate layer, a ratio $P_{C1}/P_{C2}$ of the $P_{C1}$ to the $P_{C2}$ being more than or equal to 1.03.

Figure 2:
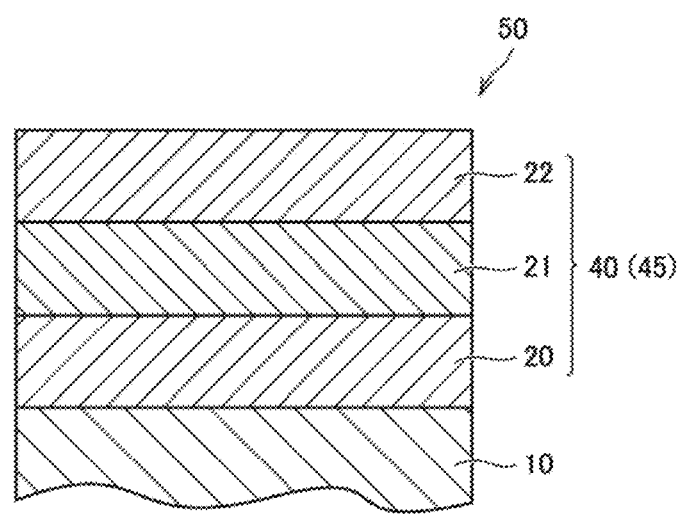
FIG. 2 is a schematic cross sectional view of a cutting tool in one aspect of the present embodiment.
Figure 3:
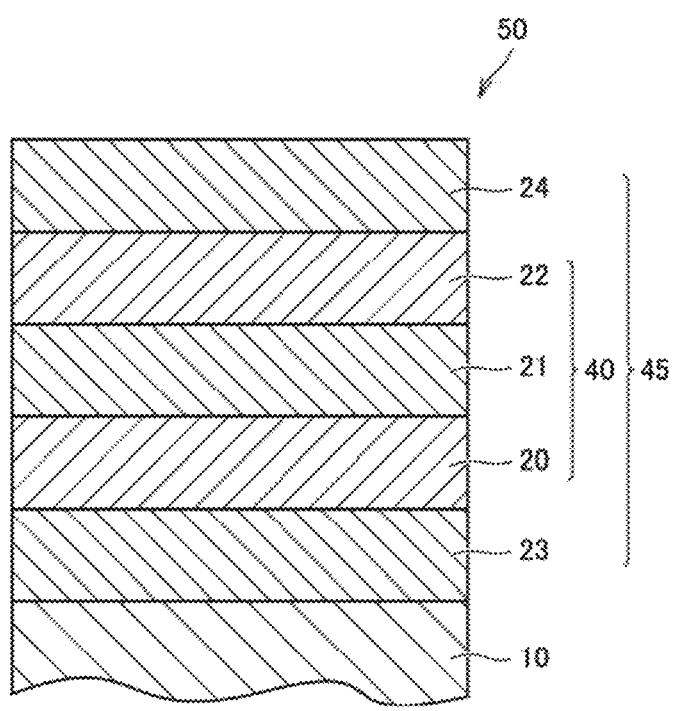
FIG. 3 is a schematic cross sectional view of a cutting tool in another aspect of the present embodiment.

A cutting tool 50 of the present embodiment includes a base material 10, and a coating layer 40 provided on base material 10 (hereinafter may be simply referred to as a "cutting tool") (FIG. 2). In addition to coating layer 40, cutting tool 50 may further include an underlying layer 23 provided between base material 10 and coating layer 40 (FIG. 3). Cutting tool 50 may further include a surface layer 24 provided on coating layer 40 (FIG. 3). Other layers such as underlying layer 23 and surface layer 24 will be described later.

It should be noted that the above layers provided on base material 10 may be collectively referred to as a "coating film". That is, cutting tool 50 includes a coating film 45 provided on base material 10, and coating film 45 includes coating layer 40. In addition, coating film 45 may further include underlying layer 23 or surface layer 24.

Cutting tool 50 of the present embodiment (hereinafter may be simply referred to as a "cutting tool") includes base material 10, and coating film 45 that coats base material 10 (see FIGS. 2 and 3). In one aspect of the present embodiment, the coating film may coat a rake face in the base material, or may coat a portion other than the rake face (for example, a flank face). The cutting tool may be a drill, an end mill, a cutting edge-replaceable cutting tip for drills, a cutting edge-replaceable cutting tip for end mills, a cutting edge-replaceable cutting tip for milling, a cutting edge-replaceable cutting tip for turning, a metal saw, a gear cutting tool, a reamer, a tap, or the like, for example.

<Base Material>

As the base material of the present embodiment, any base material can be used as long as it is conventionally known as a base material of this type. For example, the base material preferably includes at least one selected from the group consisting of cemented carbides (for example, a tungsten carbide (WC-based cemented carbide, a cemented carbide containing Co in addition to WC, a cemented carbide with a carbonitride of Cr, Ti, Ta, Nb, or the like being added thereto in addition to WC, and the like), cermets (composed mainly of TiC, TiN, TiCN, and the like), a high-speed steel, ceramics (titanium carbide, silicon carbide, silicon nitride, aluminum nitride, aluminum oxide, and the like), a cubic boron nitride sintered body (cBN sintered body), and a diamond sintered body, and more preferably includes at least one selected from the group consisting of cemented carbides, cermets, and a cBN sintered body.

Of these various base materials, a WC-based cemented carbide or a cBN sintered body is particularly preferably selected, because these base materials are particularly excellent in balance between hardness and strength at high temperature, and have excellent characteristics as the base material of the cutting tool for the use described above.

When a cemented carbide is used as the base material, the effect of the present embodiment is exhibited even if such a cemented carbide includes free carbon or an abnormal phase called η phase in the structure. It should be noted that the base material used in the present embodiment may have a reformed surface. For example, when the base material is a cemented carbide, a β-free layer may be formed on a surface thereof, and when the base material is a cBN sintered body, a surface-hardened layer may be formed. The effect of the present embodiment is exhibited even if the surface is reformed as described above.

FIG. 1 is a perspective view illustrating one aspect of the base material of the cutting tool. The base material having such a shape is used as a base material of a cutting edge-replaceable cutting tip for turning, for example. Base material 10 has a rake face 1, a flank face 2, and a cutting edge ridge line portion 3 at which rake face 1 intersects with flank face 2. That is, rake face 1 and flank face 2 are faces connected with cutting edge ridge line portion 3 being sandwiched therebetween. Cutting edge ridge line portion 3 constitutes a cutting edge tip portion of base material 10. Such a shape of base material 10 can also be recognized as the shape of the cutting tool.

When the cutting tool is a cutting edge-replaceable cutting tip, base material 10 may have a shape having a chip breaker, or may have a shape not having a chip breaker. The shape of cutting edge ridge line portion 3 includes any of a sharp edge (a ridge at which a rake face intersects with a flank face), a honed shape (a shape obtained by rounding a sharp edge), a negative land (a beveled shape), and a combination of a honed shape and a negative land.

Although the shape of base material 10 and the name of each portion thereof are described above using FIG. 1, in cutting tool 50 in accordance with the present embodiment, the same terms as those described above will be used for the shape and the name of each portion corresponding to base material 10. That is, the cutting tool has a rake face, a flank face, and a cutting edge ridge line portion which connects the rake face and the flank face.

<Coating Film>

Coating film 45 in accordance with the present embodiment includes coating layer 40 provided on base material 10 (see FIG. 2). The "coating film" has a function of improving various characteristics such as chipping resistance, wear resistance, and peel resistance in the cutting tool, by coating at least a portion of the base material (such as the rake face which comes into contact with a workpiece during cutting processing, for example). Preferably, the coating film not only coats a portion of the base material but also coats the entire surfaces of the base material. However, even if a portion of the base material is not coated with the coating film or the configuration of the coating film is partially different, such a case does not depart from the scope of the present embodiment.

The thickness of the coating film is preferably more than or equal to 7 μm and less than or equal to 30 μm, and more preferably more than or equal to 7 μm and less than or equal to 25 μm. Here, the thickness of the coating film means the sum of thicknesses of layers constituting the coating film. Examples of the "layers constituting the coating film" include the coating layer (a titanium carbonitride layer, an intermediate layer, an alumina layer), the underlying layer, and the surface layer described later, and the like. The thickness of the coating film can be determined for example by measuring thicknesses at 10 arbitrary points in a cross section sample parallel to a direction of a normal to a surface of the base material using a scanning transmission electron microscope (STEM), and calculating an average value of the thicknesses measured at the 10 points. The same applies to the measurement of the thicknesses of the coating layer (the titanium carbonitride layer, the intermediate layer, the alumina layer), the underlying layer, and the surface layer described later, and the like. Examples of the scanning transmission electron microscope include JEM-2100F (trade name) manufactured by JEOL Ltd.

(Coating Layer)

The coating layer in the present embodiment is provided on the base material. Here, "being provided on the base material" includes not only a manner of being provided directly on the base material (see FIG. 2), but also a manner of being provided on the base material with another layer being interposed therebetween (see FIG. 3). That is, as long as the effect of the present disclosure is exhibited, the coating layer may be provided directly on the base material, or may be provided on the base material with another layer such as the underlying layer described later being interposed therebetween. The coating layer may be provided thereon with another layer such as the surface layer. In addition, the coating layer may be the outermost surface of the coating film.

Coating layer 40 includes a titanium carbonitride layer 20 provided on base material 10, an intermediate layer 21 provided on titanium carbonitride layer 20 in contact therewith, and an alumina layer 22 provided on intermediate layer 21 in contact therewith (see FIG. 2).

The thickness of the coating layer is preferably more than or equal to 7 μm and less than or equal to 30 μm, and more preferably more than or equal to 7 μm and less than or equal to 25 μm. The thickness of the coating layer can be confirmed by observing a vertical cross section of the base material and the coating film with a STEM, using the same method as that described above. The titanium carbonitride layer, the intermediate layer, and the alumina layer constituting the coating layer will be described below.

(Titanium Carbonitride Layer)

Titanium carbonitride layer 20 in accordance with the present embodiment is provided on base material 10. The titanium carbonitride layer may be composed of titanium carbonitride (TiCN) only, or may be composed of titanium carbonitride and an inevitable impurity. Examples of the inevitable impurity include oxygen, chlorine, and the like. The thickness of the titanium carbonitride layer is preferably more than or equal to 3 μm and less than or equal to 20 μm, and more preferably more than or equal to 3 μm and less than or equal to 15 μm. The thickness of the titanium carbonitride layer can be confirmed by observing the vertical cross section of the base material and the coating film with a STEM, using the same method as that described above.

(Intermediate Layer)

Intermediate layer 21 in accordance with the present embodiment is provided on titanium carbonitride layer 20 in contact therewith. The intermediate layer is composed of a compound made of titanium, carbon, oxygen, and nitrogen. Examples of the compound include a carbonitroxide of titanium (TiCNO), and the like. In one aspect of the present embodiment, the intermediate layer is preferably made of TiCNO. It should be noted that the intermediate layer may be composed of only a compound made of titanium, carbon, oxygen, and nitrogen, or may be composed of the compound and an inevitable impurity. Examples of the inevitable impurity include chlorine and the like.

The thickness of the intermediate layer is more than 1 μm, preferably more than 1 μm and less than or equal to 3 μm, and more preferably more than or equal to 1.1 μm and less than or equal to 2 μm. The thickness of the intermediate layer can be confirmed by observing the vertical cross section of the base material and the coating film with a STEM, using the same method as that described above.

(Alumina Layer)

Alumina layer 22 in the present embodiment is provided on intermediate layer 21 in contact therewith. The alumina layer may be composed of aluminum oxide ($Al_2O_3$) only, or may be composed of aluminum oxide and an inevitable impurity. Examples of the inevitable impurity include chlorine, sulfur, and the like. The aluminum oxide is preferably α-type aluminum oxide (α-$Al_2O_3$). The thickness of the alumina layer is preferably more than or equal to 3 μm and less than or equal to 20 μm, and more preferably more than or equal to 3 μm and less than or equal to 15 μm. The thickness of the alumina layer can be confirmed by observing the vertical cross section of the base material and the coating film with a STEM, using the same method as that described above.

(Atomic Ratio of Carbon in Vicinity of Interface Between Intermediate Layer and Alumina Layer)

In the present embodiment, when $P_{C1}$ atomic % represents an atomic ratio of the carbon in an interface between the intermediate layer and the alumina layer, and $P_{C2}$ atomic % represents an atomic ratio of the carbon at a point A away from the interface by 1 μm on a side of the intermediate layer, a ratio $P_{C1}/P_{C2}$ of the $P_{C1}$ to the $P_{C2}$ is more than or equal to 1.03, preferably more than or equal to 1.03 and less than or equal to 1.1, more preferably more than or equal to 1.04 and less than or equal to 1.09, and further preferably more than or equal to 1.05 and less than or equal to 1.08. Here, the atomic ratios $P_{C1}$ and $P_{C2}$ of the carbon are atomic ratios based on the total of titanium, carbon, oxygen, and nitrogen.

In the intermediate layer having a configuration as described above, carbon atoms are unevenly distributed in the vicinity of the interface with the alumina layer. Accordingly, the intermediate layer has an improved toughness in the vicinity of the interface with the alumina layer. The present inventors believe that this results in an improved chipping resistance.

Figure 6:
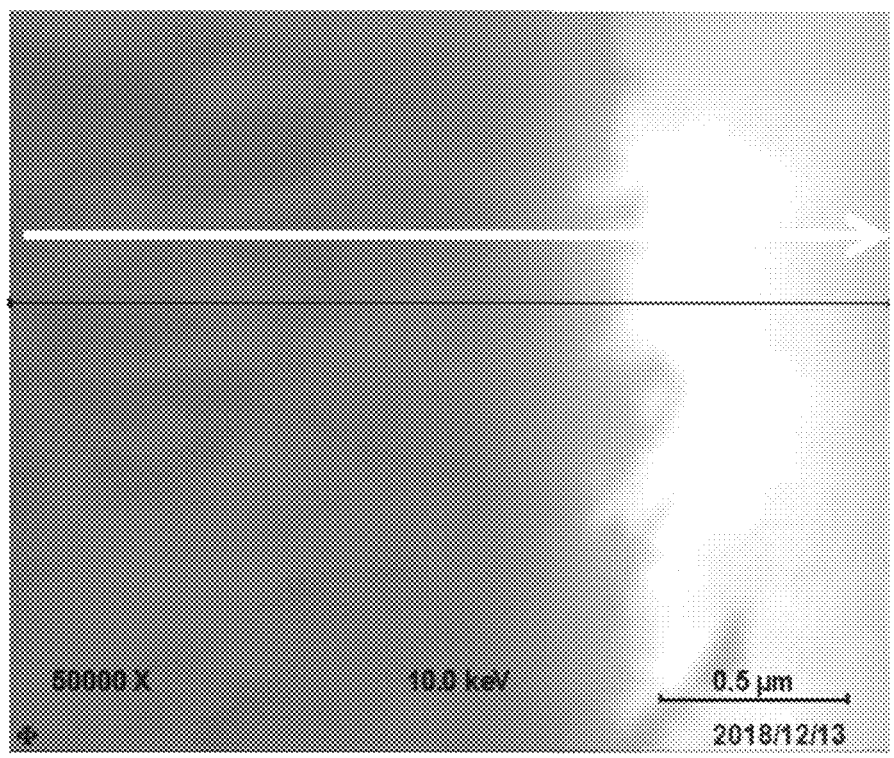
FIG. 6 is a photograph illustrating a method of line analysis in a cross section of the coating layer.

The atomic ratio of the carbon can be determined by performing line analysis on the cross section sample parallel to the direction of the normal to the surface of the base material described above by Auger electron spectroscopy (AES). Specifically, first, a cut surface of the cross section sample is polished by cross section polisher processing (CP processing) or the like. Analysis with a field emission scanning electron microscope (FE-SEM) is performed on the polished cut surface to obtain a cross sectional SEM image in the coating layer as shown in FIG. 6. The measurement magnification on this occasion is 50000 times. In FIG. 6, the coating layer is shown to extend vertically, and the intermediate layer is observed as a dark region and the alumina layer is observed as a bright region. Then, line analysis is performed on the polished cut surface by the AES, in a field of view in the cross sectional SEM image, from the titanium carbonitride layer side toward the alumina layer side in a direction parallel to a direction in which the intermediate layer is stacked (in a direction indicated by a white arrow and along a black line in FIG. 6). The measurement pitch on this occasion is 0.016 m. In addition, other measurement conditions for the AES are those described below. Examples of a measurement apparatus for the AES include PH1700 (trade name) manufactured by Ulvac-Phi, Inc.

(Measurement Conditions for AES)

Figure 4:
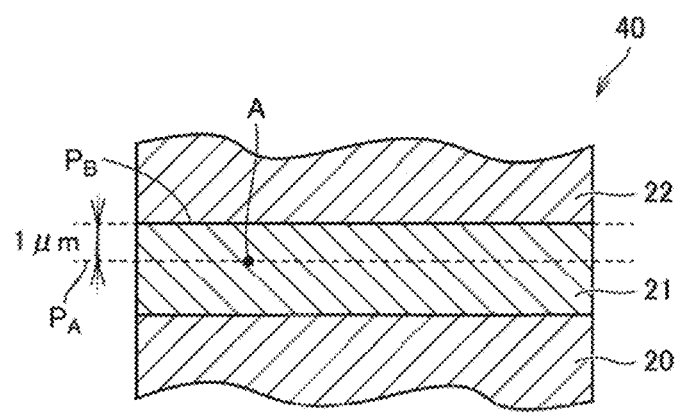
FIG. 4 is a schematic cross sectional view of a coating layer in one aspect of the present embodiment.
Figure 7:
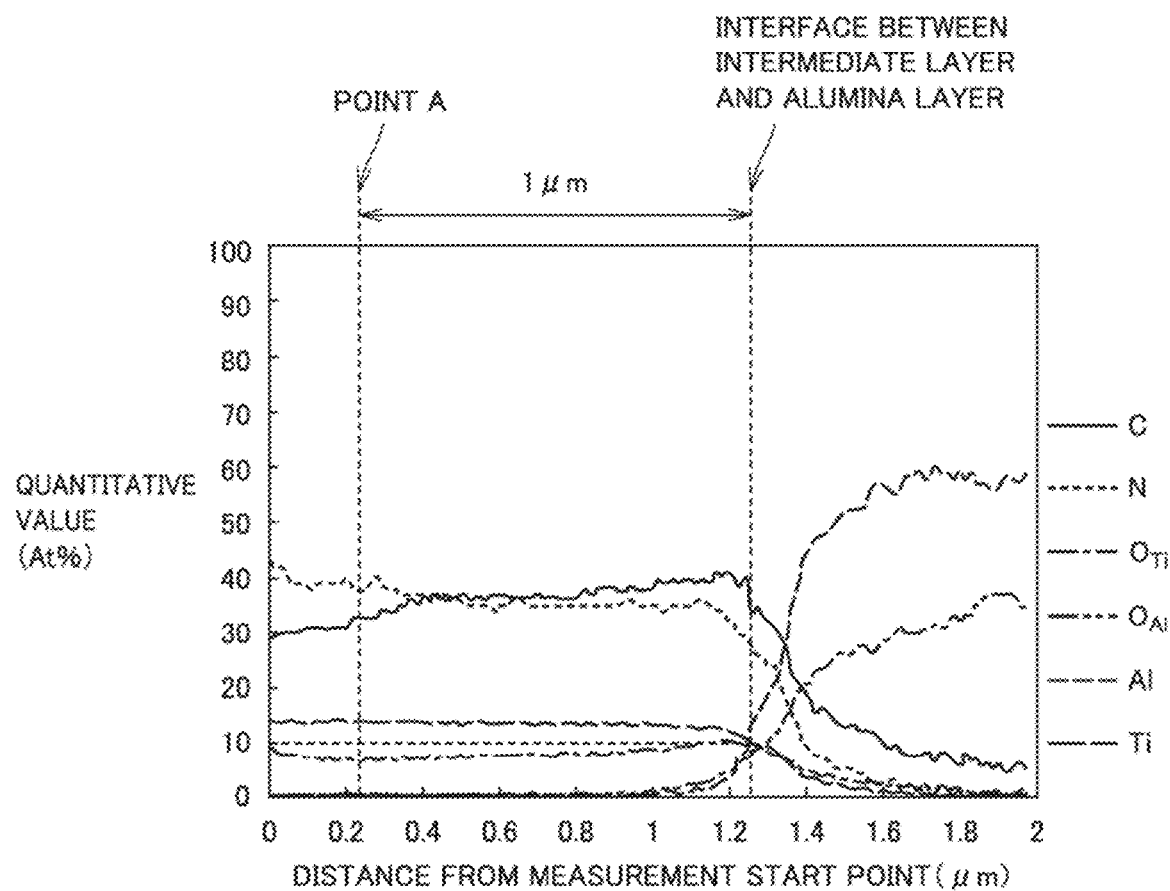
FIG. 7 is a graph showing a result of performing line analysis on the cross section of the coating layer in FIG. 6 by AES.

Measurement acceleration voltage: 10 kV
Measurement current: 10 mA
Sample inclination angle: 30°
Sputtering voltage: 1 kV FIG. 7 is one example of a graph showing a result obtained by performing the line analysis described above. In FIG. 7, the X axis (axis of abscissas) represents the distance from a measurement start point. In FIG. 7, the Y axis (axis of ordinates) represents the atomic ratio (atomic %) of each element of a measurement target. It should be noted that, although oxygen derived from the intermediate layer ($O_{Ti}$ in FIG. 7) and oxygen derived from the alumina layer ($O_{Al}$ in FIG. 7) exist in the polished cut surface described above, these two types of oxygen can be distinguished by performing waveform separation processing using standard spectra on obtained measurement data. Specifically, first, an aluminum ingot with a purity of 99.99% (manufactured by Nikola, for example) is prepared as a standard sample of aluminum. Then, mixed powder of alumina powder with a purity of 99.99% (manufactured by Ishizu Seiyaku, for example) and high-purity carbon powder is prepared as a standard sample of alumina. On this occasion, the mixed ratio of the alumina powder and the high-purity carbon powder is 1:1 in mass ratio. Spectrum measurement by the AES is performed on the prepared two types of standard samples to obtain respective standard spectra. Thereafter, waveform separation processing of a measurement spectrum is performed at each measurement point indicated by the axis of abscissas of the measurement data, using the obtained two types of standard spectra, to calculate atomic ratios of the oxygen derived from the intermediate layer and the oxygen derived from the alumina layer. Then, based on this graph, a point where the atomic ratio of Al is 10 atomic % is defined as the "interface between the intermediate layer and the alumina layer" (see FIGS. 4 and 7). In addition, a point away from the interface by 1 μm on the side of the intermediate layer is defined as the "point A" (see FIGS. 4 and 7). Then, based on the graph, the atomic ratio of the carbon in the interface between the intermediate layer and the alumina layer ($P_{C1}$) and the atomic ratio of the carbon at the point A ($P_{C2}$) are determined.

Measurement as described above is performed at least three times, and average values of the atomic ratios of the carbon determined in the respective measurements are defined as atomic ratios of the carbon ($P_{C1}$ and $P_{C2}$) in the coating layer. Atomic ratios of the nitrogen ($P_{N1}$ and $P_{N2}$) and atomic ratios of the oxygen ($P_{O1}$ and $P_{O2}$) described later can also be determined by the same method. Here, the "atomic ratios of the oxygen" mean atomic ratios of the oxygen derived from the intermediate layer.

The $P_{C1}$ is preferably more than or equal to 25 atomic % and less than or equal to 65 atomic %, more preferably more than or equal to 35 atomic % and less than or equal to 60 atomic %, and further preferably more than or equal to 40 atomic % and less than or equal to 60 atomic %.

The $P_{C2}$ is preferably more than or equal to 22 atomic % and less than or equal to 63 atomic %, and more preferably more than or equal to 35 atomic % and less than or equal to 60 atomic %.

In the present embodiment, the magnitude of an atomic ratio of the carbon in a region sandwiched between the interface referred to as a $P_B$ and a virtual plane $P_A$ including the point A is not particularly limited.

For example, when $P_{C3}$ atomic % represents an atomic ratio of the carbon at a point M (not shown) away from the interface by 0.5 μm on the side of the intermediate layer, the $P_{C3}$ may be more than or equal to the $P_{C1}$, may be less than or equal to the $P_{C2}$, or may be more than or equal to the $P_{C2}$ and less than or equal to the $P_{C1}$. In one aspect of the present embodiment, the $P_{C3}$ is preferably more than or equal to the $P_{C2}$ and less than or equal to an average value of the $P_{C1}$ and the $P_{C2}$. In another aspect of the present embodiment, the $P_{C3}$ is preferably more than or equal to 25 atomic % and less than or equal to 65 atomic %, more preferably more than or equal to 35 atomic % and less than or equal to 60 atomic %, and further preferably more than or equal to 40 atomic % and less than or equal to 60 atomic %.

In addition, when $P_{C3}$ atomic % represents the atomic ratio of the carbon at the point M (not shown) away from the interface by 0.5 μm on the side of the intermediate layer, a ratio $P_{C3}/P_{C2}$ of the $P_{C3}$ to the $P_{C2}$ is preferably more than or equal to 0.9 and less than or equal to 1.1, and more preferably more than or equal to 0.95 and less than or equal to 1.05.

(Atomic Ratio of Nitrogen in Vicinity of Interface Between Intermediate Layer and Alumina Layer)

In the present embodiment, when $P_{N1}$ atomic % represents an atomic ratio of the nitrogen in the interface, and $P_{N2}$ atomic % represents an atomic ratio of the nitrogen at the point A, a ratio $P_{N1}/P_{N2}$ of the $P_{N1}$ to the $P_{N2}$ is preferably more than or equal to 0.9 and less than 1, and more preferably more than or equal to 0.92 and less than or equal to 0.98. Here, the atomic ratios $P_{N1}$ and $P_{N2}$ of the nitrogen are atomic ratios based on the total of titanium, carbon, oxygen, and nitrogen.

In the intermediate layer having a configuration as described above, it is considered that there is a tendency that a portion including many oxygen atoms and a portion including a few oxygen atoms are unevenly distributed in a direction perpendicular to the thickness direction of the intermediate layer (in an in-plane direction), in the vicinity of the interface with the alumina layer. The present inventors believe that this results in improvement in peel resistance of the alumina layer, in addition to chipping resistance.

The $P_{N1}$ is preferably more than or equal to 5 atomic % and less than or equal to 35 atomic %, and more preferably more than or equal to 10 atomic % and less than or equal to 30 atomic %.

The $P_{N2}$ is preferably more than or equal to 5 atomic % and less than or equal to 35 atomic %, and more preferably more than or equal to 10 atomic % and less than or equal to 30 atomic %.

(Atomic Ratio of Oxygen in Vicinity of Interface Between Intermediate Layer and Alumina Layer)

In the present embodiment, when $P_{O1}$ atomic % represents an atomic ratio of the oxygen in the interface, and $P_{O2}$ atomic % represents an atomic ratio of the oxygen at the point A, a ratio $P_{O1}/P_{O2}$ of the $P_{O1}$ to the $P_{O2}$ is preferably more than or equal to 0.9 and less than 1, and more preferably more than or equal to 0.92 and less than or equal to 0.98. Here, the atomic ratios $P_{O1}$ and $P_{O2}$ of the oxygen are atomic ratios based on the total of titanium, carbon, oxygen, and nitrogen. In addition, the "atomic ratios of the oxygen" mean atomic ratios of the oxygen derived from the intermediate layer.

In the intermediate layer having a configuration as described above, it is considered that there is a tendency that a portion including many nitrogen atoms and a portion including a few nitrogen atoms are unevenly distributed in the direction perpendicular to the thickness direction of the intermediate layer (in the in-plane direction), in the vicinity of the interface with the alumina layer. The present inventors believe that this results in improvement in wear resistance, in addition to chipping resistance.

The $P_{O1}$ is preferably more than or equal to 5 atomic % and less than or equal to 25 atomic %, and more preferably more than or equal to 10 atomic % and less than or equal to 20 atomic %.

The $P_{O2}$ is preferably more than or equal to 5 atomic % and less than or equal to 25 atomic %, and more preferably more than or equal to 10 atomic % and less than or equal to 20 atomic %.

(Underlying Layer)

Preferably, in the cutting tool, an underlying layer is further provided between base material 10 and coating layer 40 (see FIG. 3). Underlying layer 23 preferably includes TiN. The TiN is preferably a cubic crystal.

The thickness of the underlying layer is preferably more than or equal to 0.1 μm and less than or equal to 3 μm, and more preferably more than or equal to 0.3 μm and less than or equal to 1 μm. Such a thickness can be confirmed by observing the vertical cross section of the base material and the coating film with a scanning transmission electron microscope (STEM) or the like, in the same manner as that described above.

(Surface Layer)

Preferably, in the cutting tool, a surface layer is further provided on the coating layer (see FIG. 3). Surface layer 24 preferably includes a compound made of a titanium element and at least one element selected from the group consisting of C, N, and B.

Examples of the compound included in the surface layer include TiC, TiN, TiCN, $TiB_2$, and the like.

The thickness of the surface layer is preferably more than or equal to 0.1 μm and less than or equal to 3 μm, and more preferably more than or equal to 0.3 μm and less than or equal to 1.5 μm. Such a thickness can be confirmed by observing the vertical cross section of the base material and the coating film with a scanning transmission electron microscope (STEM) or the like, in the same manner as that described above.

(Another Layer)

The coating film may further include another layer, as long as the effect exhibited by the cutting tool in accordance with the present embodiment is not impaired. The composition of the other layer may be different from or the same as that of the titanium carbonitride layer, the intermediate layer, the alumina layer, the underlying layer, or the surface layer. Examples of a compound included in the other layer include TiN, TiCN, TiBN, $Al_2O_3$, and the like. It should be noted that the order of stacking the other layer is not particularly limited. The thickness of the other layer is not particularly limited as long as the effect of the present embodiment is not impaired, and for example, is more than or equal to 0.1 μm and less than or equal to 20 μm.

<<Method for Manufacturing Cutting Tool>>

A method for manufacturing the cutting tool in accordance with the present embodiment includes:

a first step of preparing the base material (hereinafter may be simply referred to as a "first step");

a second step of forming the titanium carbonitride layer on the base material by a chemical vapor deposition method (hereinafter may be simply referred to as a "second step");

a third step of forming the intermediate layer directly on the titanium carbonitride layer by the chemical vapor deposition method, using a source material gas including a gas containing titanium as a constituent element, a gas containing nitrogen as a constituent element, a carbon monoxide gas, and a methane gas (hereinafter may be simply referred to as a "third step"); and a fourth step of forming the alumina layer directly on the intermediate layer by the chemical vapor deposition method (hereinafter may be simply referred to as a "fourth step"), wherein in the third step, the intermediate layer is formed while increasing a partial pressure ratio $P_{CH4}/P_{N2g}$ of the methane gas to the gas containing nitrogen as a constituent element.

<First Step: Step of Preparing Base Material>

In the first step, the base material is prepared. For example, a cemented carbide base material is prepared as the base material. The cemented carbide base material may be a commercially available product, or may be manufactured by a common powder metallurgy method. When the cemented carbide base material is manufactured by a common powder metallurgy method, for example, WC powder, Co powder, and the like are mixed by a ball mill or the like to obtain mixed powder. The mixed powder is dried, and thereafter is molded into a predetermined shape to obtain a molded body. Further, the molded body is sintered to obtain a WC—Co-based cemented carbide (sintered body). Subsequently, the sintered body is subjected to predetermined cutting edge processing such as honing, and thereby a base material made of a WC—Co-based cemented carbide can be manufactured. In the first step, any base material other than that described above can be prepared, as long as it is conventionally known as a base material of this type.

<Second Step: Step of Forming Titanium Carbonitride Layer on Base Material>

In the second step, the titanium carbonitride layer is formed on the base material by the chemical vapor deposition method (CVD method).

Figure 5:
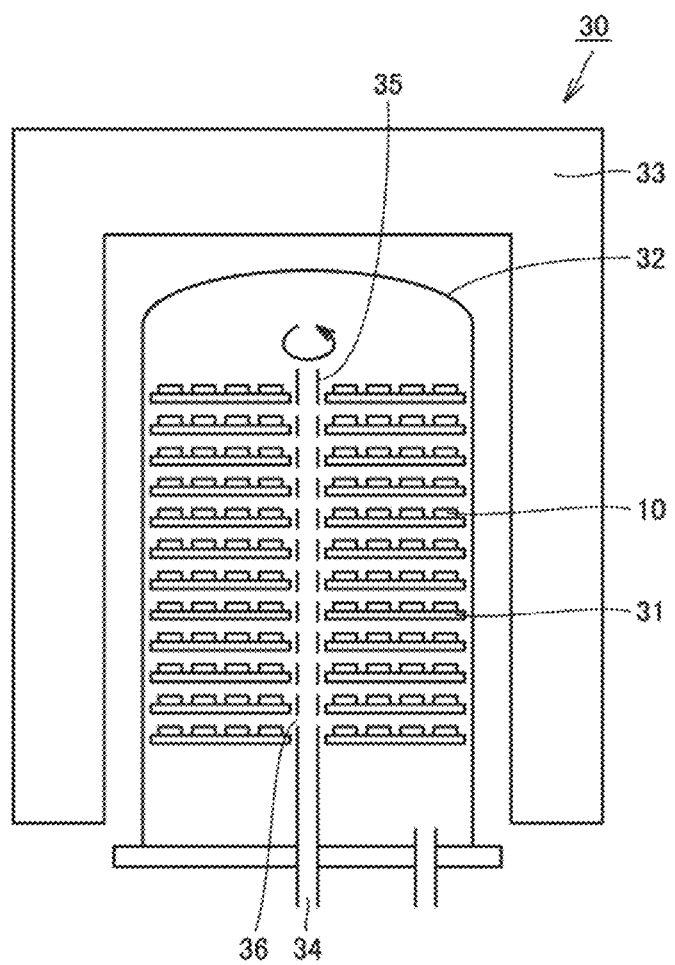
FIG. 5 is a schematic cross sectional view showing one example of a chemical vapor deposition apparatus used to manufacture a coating film.

FIG. 5 is a schematic cross sectional view showing one example of a chemical vapor deposition apparatus (CVD apparatus) used to manufacture the coating film. The second step will be described below with reference to FIG. 5. CVD apparatus 30 includes a plurality of base material setting jigs 31 for holding base materials 10, and a reaction container 32 made of a heat-resistant alloy steel covering base material setting jigs 31. In addition, a temperature adjustment apparatus 33 for controlling the temperature within reaction container 32 is provided around reaction container 32. A gas introduction pipe 35 having a gas introduction port 34 is provided to reaction container 32. Gas introduction pipe 35 is arranged in an internal space of reaction container 32 in which base material setting jigs 31 are arranged, to extend in a vertical direction and to be rotatable about the vertical direction. In addition, a plurality of ejection holes 36 for ejecting a gas into reaction container 32 are provided to gas introduction pipe 35. Using this CVD apparatus 30, the titanium carbonitride layer and the like constituting the coating layer can be formed as described below.

First, base materials 10 are set to base material setting jigs 31, and a source material gas for the titanium carbonitride layer is introduced into reaction container 32 through gas introduction pipe 35 while controlling the temperature and the pressure within reaction container 32 to be in predetermined ranges. Thereby, titanium carbonitride layer 20 is formed on base material 10. Here, it is preferable to form an underlying layer (for example, a layer including TiN) on a surface of base material 10 by introducing a source material gas for the underlying layer into reaction container 32 through gas introduction pipe 35, before forming titanium carbonitride layer 20 (that is, before the second step). A method for forming titanium carbonitride layer 20 after forming the underlying layer on the surface of base material 10 will be described below.

The source material gas for the underlying layer is not particularly limited, and examples thereof include a mixed gas of $TiCl_4$ and $N_2$.

The temperature within reaction container 32 during formation of the underlying layer is preferably controlled to 1000 to 1100° C. The pressure within reaction container 32 during formation of the underlying layer is preferably controlled to 0.1 to 1013 hPa. It should be noted that it is preferable to use $H_2$ as a carrier gas. In addition, it is preferable to rotate gas introduction pipe 35 by a drive unit not shown during gas introduction. Thereby, each gas can be uniformly dispersed within reaction container 32.

Further, the underlying layer may be formed by a medium temperature (MT)-CVD method. Unlike a CVD method implemented at a temperature of 1000 to 1100° C. (hereinafter also referred to as a "HT-CVD method"), the MT-CVD method is a method of forming a layer while maintaining the temperature within reaction container 32 at a relatively low temperature such as 850 to 950° C. Since the MT-CVD method is implemented at a relatively low temperature when compared with the HT-CVD method, damage to base material 10 due to heating can be reduced. In particular, when the underlying layer is a TiN layer, it is preferable to form the underlying layer by the MT-CVD method.

Then, the titanium carbonitride layer is formed on the underlying layer. As a source material gas, a mixed gas of $TiCl_4$, $CH_3CN$, and $N_2$ is used, for example.

The content ratio of $TiCl_4$ in the source material gas is preferably 0.8 to 3.0 volume %, more preferably 1.0 to 2.7 volume %, and further preferably 1.5 to 2.5 volume %. A preferable flow rate of $TiCl_4$ is 1.0 to 2.5 L/min.

The content ratio of $CH_3CN$ in the source material gas is preferably 0.2 to 1.5 volume %, more preferably 0.3 to 1.2 volume %, and further preferably 0.5 to 1.0 volume %. A preferable flow rate of $CH_3CN$ is 0.5 to 2.0 L/min.

The content ratio of $N_2$ in the source material gas is preferably 10 to 30 volume %, more preferably 15 to 28 volume %, and further preferably 17 to 25 volume %. A preferable flow rate of $N_2$ is 10 to 25 L/min.

The temperature within reaction container 32 is preferably controlled to 950 to 1000° C. The pressure within reaction container 32 is preferably controlled to 50 to 100 hPa. In addition, $H_2$ can be used as a carrier gas. It should be noted that, as described above, it is preferable to rotate gas introduction pipe 35 during gas introduction.

Regarding the manufacturing method described above, the manner of each layer is changed by controlling conditions for the CVD method. For example, the composition of each layer is determined by the composition of the source material gas introduced into reaction container 32. The thickness of each layer is controlled by an implementation time (a film formation time).

<Third Step: Step of Forming Intermediate Layer Directly on Titanium Carbonitride Layer>

In the third step, the intermediate layer is formed directly on the titanium carbonitride layer by the chemical vapor deposition method, using a source material gas including a gas containing titanium as a constituent element, a gas containing nitrogen as a constituent element, a carbon monoxide gas, and a methane gas.

As the source material gas, for example, a mixed gas of $TiCl_4$ (a gas containing titanium as a constituent element), $CH_4$, CO, and $N_2$ (a gas containing nitrogen as a constituent element) is used.

The content ratio of $TiCl_4$ in the source material gas is preferably 0.5 to 2.5 volume %, more preferably 0.7 to 2.0 volume %, and further preferably 0.8 to 1.5 volume %. A preferable flow rate of $TiCl_4$ is 0.5 to 1.0 L/min.

The content ratio of $CH_4$ in the source material gas is preferably 2.0 to 7.0 volume %, more preferably 2.0 to 6.0 volume %, and further preferably 2.5 to 4.5 volume %. A preferable flow rate of $CH_4$ is 1.3 to 3.0 L/min.

The content ratio of CO in the source material gas is preferably 0.5 to 3.0 volume %, more preferably 0.7 to 2.5 volume %, and further preferably 1.0 to 2.0 volume %. A preferable flow rate of CO is 0.6 to 1.5 L/min.

The content ratio of $N_2$ in the source material gas is preferably 8 to 30 volume %, more preferably 7 to 25 volume %, and further preferably κ to 20 volume %. A preferable flow rate of $N_2$ is 4 to 15 L/min.

Here, in the third step, it is preferable to form the intermediate layer while increasing the partial pressure ratio $P_{CH4}/P_{N2g}$ of the methane gas ($CH_4$) to the gas containing nitrogen as a constituent element (for example, $N_2$).

Conventionally, an idea of actively changing a partial pressure of a source material gas during film formation has not been conceived, from the viewpoint of suppressing manufacturing cost and the like. In addition, it has been possible to form a coating film having a desired quality, even without changing the partial pressure.

However, in cutting processing in recent years, there has been a tendency that further increase in speed and efficiency is promoted, a load imposed on a cutting tool is increased, and thereby the cutting tool has a shorter life. In view of such circumstances, the present inventors have conducted earnest study, and as a result, have found that the ratio $P_{C1}/P_{C2}$ described above can be set in a predetermined range by forming the intermediate layer while increasing the partial pressure ratio $P_{CH4}/P_{N2g}$.

The partial pressure ratio $P_{CH4}/P_{N2g}$ at the start of the third step is preferably 0.1 to 0.6, and more preferably 0.2 to 0.5.

The partial pressure ratio $P_{CH4}/P_{N2g}$ at the end of the third step is preferably 0.11 to 0.65, and more preferably 0.2 to 0.5. It should be noted that, it is needless to say that the partial pressure ratio $P_{CH4}/P_{N2g}$ at the end is higher than the partial pressure ratio $P_{CH4}/P_{N2g}$ at the start.

The temperature within reaction container 32 is preferably controlled to 920 to 980° C. The pressure within reaction container 32 is preferably controlled to 50 to 250 hPa. In addition, $H_2$ can be used as a carrier gas. It should be noted that, as described above, it is preferable to rotate gas introduction pipe 35 during gas introduction.

<Fourth Step: Step of Forming Alumina Layer Directly on Intermediate Layer>

In the fourth step, the alumina layer is formed directly on the intermediate layer by the chemical vapor deposition method.

As a source material gas, for example, a mixed gas of $AlCl_3$, $CO_2$, $H_2S$, and HCl is used.

The content ratio of $AlCl_3$ in the source material gas is preferably 0.5 to 6.0 volume %, more preferably 1.0 to 5.0 volume %, and further preferably 2.0 to 4.0 volume %. A preferable flow rate of $AlCl_3$ is 0.75 to 3.5 L/min.

The content ratio of $CO_2$ in the source material gas is preferably 0.3 to 3 volume %, more preferably 0.4 to 2.5 volume %, and further preferably 0.5 to 2.0 volume %. A preferable flow rate of $CO_2$ is 0.25 to 2.0 L/min.

The content ratio of $H_2S$ in the source material gas is preferably 0.02 to 2.0 volume %, more preferably 0.04 to 1.8 volume %, and further preferably 0.05 to 1.5 volume %. A preferable flow rate of $H_2S$ is 0.5 to 5.0 L/min.

The content ratio of HCl in the source material gas is preferably 0.5 to 6.0 volume %, more preferably 0.7 to 5.5 volume %, and further preferably 1.0 to 5.0 volume %. A preferable flow rate of HCl is 0.5 to 5.0 U/min, and a more preferable flow rate of HCl is 1.0 to 5.0 L/min.

The temperature within reaction container 32 is preferably controlled to 950 to 1000° C. The pressure within reaction container 32 is preferably controlled to 50 to 200 hPa. In addition, $H_2$ can be used as a carrier gas. It should be noted that, as described above, it is preferable to rotate gas introduction pipe 35 during gas introduction.

<Other Steps>

In the manufacturing method in accordance with the present embodiment, in addition to the steps described above, additional steps may be performed as appropriate, as long as the effect of the present embodiment is not impaired. Examples of the additional steps include a step of forming the surface layer on the alumina layer, a step of performing blasting on the coating film, and the like. A method for forming the surface layer is not particularly limited, and examples thereof include a method for forming the surface layer by the CVD method or the like.

The above description includes features noted below.

(Note 1)

A cutting tool comprising a base material and a coating layer provided on the base material,
  the coating layer including a titanium carbonitride layer provided on the base material, an intermediate layer provided on the titanium carbonitride layer in contact therewith, and an alumina layer provided on the intermediate layer in contact therewith,
  the intermediate layer being composed of a compound made of titanium, carbon, oxygen, and nitrogen,
  the intermediate layer having a thickness of more than 1 μm,
  when $P_{C1}$ atomic % represents an atomic ratio of the carbon in an interface between the intermediate layer and the alumina layer, and $P_{C2}$ atomic % represents an atomic ratio of the carbon at a point A away from the interface by 1 μm on a side of the intermediate layer, a ratio $P_{C1}/P_{C2}$ of the $P_{C1}$ to the $P_{C2}$ being more than or equal to 1.03.

(Note 2)

The cutting tool according to note 1, wherein, when $P_{N1}$ atomic % represents an atomic ratio of the nitrogen in the interface, the atomic ratio $P_{N1}$ of the nitrogen is more than or equal to 5 atomic % and less than or equal to 35 atomic %.

(Note 3)

The cutting tool according to note 1 or 2, wherein, when $P_{O1}$ atomic % represents an atomic ratio of the oxygen in the interface, the atomic ratio $P_{O1}$ of the oxygen is more than or equal to 5 atomic % and less than or equal to 25 atomic %.

(Note 4)

The cutting tool according to any one of notes 1 to 3, wherein the alumina layer has a thickness of more than or equal to 3 μm and less than or equal to 20 μm.

(Note 5)

The cutting tool according to any one of notes 1 to 4, wherein the titanium carbonitride layer has a thickness of more than or equal to 3 μm and less than or equal to 20 μm.

Examples

In the following, the present invention will be described in detail with reference to examples, although the present invention is not limited thereto.

<<Fabrication of Cutting Tool>>

<First Step: Step of Preparing Base Material>

As a base material, a cemented carbide cutting tip having a composition including TaC (2.0 mass %), NbC (1.0 mass %), Co (10.0 mass %), and WC (remainder)(however, an inevitable impurity is included)(type: CNMG120408N-UX, manufactured by Sumitomo Electric Hardmetal Corp., JIS B4120 (2013)) was prepared.

<Step of Forming Underlying Layer>

Prior to the second step described later, an underlying layer was formed on the prepared base material, using a CVD apparatus. Conditions for forming the underlying layer are described below. It should be noted that the value within parentheses that follows each gas composition indicates the flow rate (L/min) of each gas. In addition, the thickness of the underlying layer and the composition of the underlying layer are shown in Table 1.

(Underlying Layer: TiN)

Source material gas: $TiCl_4$ (15 L/min), $N_2$ (20 L/min), $H_2$ (80 L/min)

Pressure: 95 hPa

Temperature: 860° C.

Film formation time: adjusted as appropriate to have a thickness shown in Table 1.

<Second Step: Step of Forming Titanium Carbonitride Layer on Base Material>

A titanium carbonitride layer was formed on the base material having the underlying layer formed thereon, using the CVD apparatus, and then the procedure moved on to the subsequent third step. Conditions for forming the titanium carbonitride layer are described below. In addition, the thickness of the titanium carbonitride layer and the composition of the titanium carbonitride layer are shown in Table 1.

(Titanium Carbonitride Layer: TiCN)

Source material gas: $TiCl_4$ (2.0 L/min), $CH_3CN$ (0.8 L/min), $N_2$ (20 L/min), $H_2$ (65 L/min)

Pressure: 75 hPa

Temperature: 975° C.

Film formation time: adjusted as appropriate to have a thickness shown in Table 1.

<Third Step: Step of Forming Intermediate Layer Directly on Titanium Carbonitride Layer>

Then, an intermediate layer was formed on the base material having the titanium carbonitride layer formed thereon, using the CVD apparatus. Conditions for forming the intermediate layer are described below. In addition, the thickness of the intermediate layer and the composition of the intermediate layer are shown in Table 1. Here, the partial pressure ratio $P_{CH4}/P_{N2g}$ of the methane gas to the nitrogen gas in the third step is shown in Table 2.

(Intermediate Layer: TiCNO)

Source material gas: $TiCl_4$ (0.8 L/min), $CH_4$ (1.3 to 3.0 L/min), CO (1.0 L/min), $N_2$ (6 to 12 L/min), $H_2$ (35 L/min)

Pressure: 175 hPa

Temperature: 960° C.

Film formation time: adjusted as appropriate to have a thickness shown in Table 1.

<Fourth Step: Step of Forming Alumina Layer Directly on Intermediate Layer>

Then, an alumina layer was formed on the base material having the intermediate layer formed thereon, using the CVD apparatus. Conditions for forming the alumina layer are described below. In addition, the thickness of the alumina layer and the composition of the alumina layer are shown in Table 1.

(Alumina Layer: α-$Al_2O_3$)

Source material gas: $AlCl_3$ (2.1 L/min), $CO_2$ (0.5 L/min), $H_2S$ (0.5 L/min), HCl (2.1 L/min), $H_2$ (50 L/min)

Pressure: 150 hPa

Temperature: 980° C.

Film formation time: adjusted as appropriate to have a thickness shown in Table 1.

<Step of Forming Surface Layer>

Finally, a surface layer was formed on the base material having the alumina layer formed thereon (with the exclusion of samples 4, 12, and 103), using the CVD apparatus. Conditions for forming the surface layer are described below. In addition, the thickness and the composition of the surface layer are shown in Table 1. It should be noted that the part indicated by "-" in Table 1 means that the corresponding layer is not provided.

(Surface Layer: TiN, TiC, or TiCN)

(In the Case of TiN)

Source material gas: $TiCl_4$ (4 L/min), $N_2$ (20 L/min), $H_2$ (70 L/min)

Pressure: 140 hPa

Temperature: 990° C.

Film formation time: adjusted as appropriate to have a thickness shown in Table 1.

(In the Case of TiC)

Source material gas: $TiCl_4$ (2 L/min), $CH_4$ (3 L/min), $H_2$ (75 L/min)

Pressure: 300 hPa

Temperature: 980° C.

Film formation time: adjusted as appropriate to have a thickness shown in Table 1.

(In the Case of TiCN)

Source material gas: $TiCl_4$ (4.5 L/min), $CH_3CN$ (2.5 L/min), $N_2$ (35 L/min), $H_2$ (65 L/min)

Pressure: 75 hPa

Temperature: 975° C.

Film formation time: adjusted as appropriate to have a thickness shown in Table 1.

TABLE 1

| Sample | Underlying Layer Thickness (μm) | Titanium Carbonitride Layer Thickness (μm) | Intermediate Layer Thickness (μm) | Alumina Layer Thickness (μm) | Surface Layer Thickness (μm) |
|---|---|---|---|---|---|
| 1 | TiN (0.2) | TiCN (15.0) | TiCNO (1.1) | α-Al$_2$O$_3$ (10.0) | TiN (1.0) |
| 2 | TiN (0.5) | TiCN (16.5) | TiCNO (1.6) | α-Al$_2$O$_3$ (6.0) | TiC (0.5) |
| 3 | TiN (0.3) | TiCN (13.5) | TiCNO (2) | α-Al$_2$O$_3$ (4.5) | TiCN (1.5) |
| 4 | TiN (0.4) | TiCN (9.5) | TiCNO (1.2) | α-Al$_2$O$_3$ (7.5) | — |
| 5 | TiN (0.7) | TiCN (18.5) | TiCNO (1.2) | α-Al$_2$O$_3$ (3.5) | TiC (1.0) |
| 6 | TiN (0.3) | TiCN (12.5) | TiCNO (1.3) | α-Al$_2$O$_3$ (12.5) | TiN (1.0) |
| 7 | TiN (0.8) | TiCN (18.5) | TiCNO (1.4) | α-Al$_2$O$_3$ (5.5) | TiC (1.5) |
| 8 | TiN (0.9) | TiCN (7.0) | TiCNO (2.5) | α-Al$_2$O$_3$ (7.5) | TiCN (1.0) |
| 9 | TiN (0.5) | TiCN (12.0) | TiCNO (1.4) | α-Al$_2$O$_3$ (8.0) | TiCN (2.0) |
| 10 | TiN (1.1) | TiCN (6.5) | TiCNO (1.3) | α-Al$_2$O$_3$ (9.5) | TiN (1.5) |
| 11 | TiN (0.4) | TiCN (17.5) | TiCNO (1.6) | α-Al$_2$O$_3$ (10.5) | TiC (1.0) |
| 12 | TiN (1.2) | TiCN (10.5) | TiCNO (3.2) | α-Al$_2$O$_3$ (4.5) | — |
| 13 | TiN (0.3) | TiCN (12.0) | TiCNO (1.2) | α-Al$_2$O$_3$ (3.5) | TiCN (0.5) |
| 14 | TiN (0.6) | TiCN (14.5) | TiCNO (1.4) | α-Al$_2$O$_3$ (6.5) | TiC (0.5) |
| 15 | TiN (0.7) | TiCN (11.0) | TiCNO (1.7) | α-Al$_2$O$_3$ (7.0) | TiCN (1.0) |
| 101 | TiN (0.6) | TiCN (8.0) | TiCNO (1.1) | α-Al$_2$O$_3$ (5.0) | TiN (1 0) |
| 102 | TiN (0.7) | TiCN (9.5) | TiCNO (2.7) | α-Al$_2$O$_3$ (6.0) | TiC (1.5) |
| 103 | TiN (1.1) | TiCN (15.5) | TiCNO (1.6) | α-Al$_2$O$_3$ (4.5) | — |
| 104 | TiN (0.5) | TiCN (12.5) | TiCNO (1.3) | α-Al$_2$O$_3$ (7.0) | TiCN (1.0) |

TABLE 2

| | Partial Pressure Ratio in Third Step $P_{CH4}/P_{N2g}$ | |
|---|---|---|
| Sample | at the start | at the end |
| 1 | 0.11 | 0.35 |
| 2 | 0.13 | 0.45 |
| 3 | 0.20 | 0.35 |
| 4 | 0.18 | 0.40 |
| 5 | 0.25 | 0.45 |
| 6 | 0.30 | 0.50 |
| 7 | 0.35 | 0.45 |
| 8 | 0.22 | 0.35 |
| 9 | 0.40 | 0.48 |
| 10 | 0.36 | 0.45 |
| 11 | 0.22 | 0.38 |
| 12 | 0.13 | 0.40 |
| 13 | 0 21 | 0.40 |
| 14 | 0.19 | 0.45 |
| 15 | 0.15 | 0.30 |
| 101 | 0.70 | 0.20 |
| 102 | 0.50 | 0.90 |
| 103 | 0.60 | 0.60 |
| 104 | 0.80 | 0.70 |

Through the above procedure, cutting tools of samples 1 to 15 and samples 101 to 104 were fabricated.

<<Evaluation of Characteristics of Cutting Tools>>

Using the cutting tools of the samples fabricated as described above, characteristics of the cutting tools were evaluated as described below. Here, samples 1 to 15 correspond to examples, and samples 101 to 104 correspond to comparative examples.

<Measurement of Thickness of Each Layer Constituting Coating Film>

The thickness of each layer constituting the coating film was determined by measuring thicknesses at 10 arbitrary points in a cross section sample parallel to a direction of a normal to a surface of the base material using a scanning transmission electron microscope (STEM) (trade name: JEM-2100F, manufactured by JEOL Ltd.), and calculating an average value of the thicknesses measured at the 10 points. Table 1 shows the results.

<Atomic Ratio of Each Element in Vicinity of Interface Between Intermediate Layer and Alumina Layer (AES Measurement)>

The atomic ratio of each element (such as oxygen, nitrogen, carbon, or aluminum) in the vicinity of an interface between the intermediate layer and the alumina layer was determined by performing line analysis on the cross section sample parallel to the direction of the normal to the surface of the base material described above by Auger electron spectroscopy (AES). Specifically, first, a cut surface of the cross section sample was polished by cross section polisher processing. Analysis with a field emission scanning electron microscope (FE-SEM) was performed on the polished cut surface to obtain a cross sectional SEM image in the coating layer (for example, FIG. 6). The measurement magnification on this occasion was 50000 times. In FIG. 6, the intermediate layer is observed as a dark region and the alumina layer is observed as a bright region. Then, line analysis was performed on the polished cut surface by the AES, in a field of view in the cross sectional SEM image, from the titanium carbonitride layer side toward the alumina layer side in a direction parallel to a direction in which the intermediate layer was stacked (for example, in a direction indicated by the white arrow and along the black line in FIG. 6). The measurement pitch on this occasion was 0.016 μm. Other measurement conditions for the AES were those described below.

(Measurement Conditions for AES)
  Measurement apparatus: manufactured by Ulvac-Phi, Inc., trade name: PHI700
  Measurement acceleration voltage: 10 kV
  Measurement current: 10 mA
  Sample inclination angle: 30°
  Sputtering voltage: 1 kV A graph was produced from data obtained by the line analysis described above (for example, FIG. 7). In this graph, the X axis (axis of abscissas) represents the distance from a measurement start point, and the Y axis (axis of ordinates) represents the atomic ratio (atomic %) of each element of a measurement target. Here, although oxygen derived from the intermediate layer ($O_{Ti}$) and oxygen derived from the alumina layer ($O_{Al}$) existed in the polished cut surface described above, these two types of oxygen were distinguished by performing waveform separation processing using standard spectra on obtained measurement data. Specifically, first, an aluminum ingot with a purity of 99.99% (manufactured by Nikola) was prepared as a standard sample of aluminum. Then, mixed powder of alumina powder with a purity of 99.99/(manufactured by Ishizu Seiyaku) and high-purity carbon powder (manufactured by Kojundo Chemical Laboratory) was prepared as a standard sample of alumina. On this occasion, the mixed ratio of the alumina powder and the high-purity carbon powder was 1:1 in mass ratio. Spectrum measurement by the AES was performed on the prepared two types of standard samples to obtain respective standard spectra. Thereafter, waveform separation processing of a measurement spectrum was performed at each measurement point indicated by the axis of abscissas of the measurement data, using the obtained two types of standard spectra, to calculate atomic ratios of the oxygen derived from the intermediate layer and the oxygen derived from the alumina layer. Then, based on this graph, a point where the atomic ratio of Al was 10 atomic % was defined as the "interface between the intermediate layer and the alumina layer" (see FIG. 7, for example). In addition, a point away from the interface by 1 μm on the side of the intermediate layer was defined as the "point A" (see FIG. 7, for example). In addition, a point away from the interface by 0.5 μm on the side of the intermediate layer was defined as the "point M" (not shown). Then, based on the graph, the atomic ratios of the oxygen, nitrogen, and carbon in the interface between the intermediate layer and the alumina layer ($P_{O1}$, $P_{N1}$, and $P_{C1}$), the atomic ratios of the oxygen, nitrogen, and carbon at the point A ($P_{O2}$, $P_{N2}$, and $P_{C2}$), and the atomic ratio of the carbon at the point M ($P_{C3}$) were determined. Such measurement was performed three times, and average values of the atomic ratios of each element determined in the respective measurements were defined as atomic ratios of that element in the coating layer. In addition, based on the above results, ratios between the atomic ratios ($P_{O1}/P_{O2}$, $P_{N1}/P_{N2}$, $P_{C1}/P_{C2}$, and $P_{C3}/P_{C2}$) were determined Table 3 shows the results.

TABLE 3

| | Carbon | | | | | Nitrogen | | | Oxygen | | |
|---|---|---|---|---|---|---|---|---|---|---|---|
| | Atomic Ratio (atomic %) | | | Ratio between Atomic Ratios | | Atomic Ratio (atomic %) | | Ratio between Atomic Ratios | Atomic Ratio (atomic %) | | Ratio between Atomic Ratios |
| Sample | $P_{C1}$ | $P_{C2}$ | $P_{C3}$ | $P_{C1}/P_{C2}$ | $P_{C3}/P_{C2}$ | $P_{N1}$ | $P_{N2}$ | $P_{N1}/P_{N2}$ | $P_{O1}$ | $P_{O2}$ | $P_{O1}/P_{O2}$ |
| 1 | 55 | 51.8 | 53.4 | 1.06 | 1.03 | 6.6 | 7 | 0.94 | 7.8 | 8 | 0.98 |
| 2 | 48 | 44.8 | 45.3 | 1.07 | 1.01 | 9.2 | 10 | 0.92 | 11.3 | 12 | 0.94 |
| 3 | 52 | 48.1 | 51.5 | 1.08 | 1.07 | 8.5 | 9 | 0.94 | 9.6 | 10 | 0.96 |
| 4 | 51 | 47.2 | 49.1 | 1.08 | 1.04 | 12.5 | 12 | 1.04 | 7.8 | 8 | 0.98 |
| 5 | 49 | 46.2 | 50.8 | 1.06 | 1.1 | 15.1 | 14 | 1.08 | 8.4 | 9 | 0.93 |
| 6 | 53 | 49.1 | 51.1 | 1.08 | 1.04 | 5.5 | 6 | 0.92 | 11.2 | 11 | 1.02 |
| 7 | 44 | 42.3 | 41.5 | 1.04 | 0.98 | 11.4 | 12 | 0.95 | 12.5 | 12 | 1.04 |
| 8 | 41 | 39.0 | 39.8 | 1.05 | 1.02 | 15.3 | 15 | 1.02 | 10.3 | 10 | 1.03 |
| 9 | 25 | 23.1 | 25.5 | 1.08 | 1.1 | 30.7 | 32 | 0.96 | 20 | 21 | 0.95 |
| 10 | 65 | 62.5 | 63.1 | 1.04 | 1.01 | 7.4 | 8 | 0.93 | 6.6 | 7 | 0.94 |
| 11 | 53 | 49.5 | 51 | 1.07 | 1.03 | 8.7 | 9 | 0.97 | 9.6 | 10 | 0.96 |
| 12 | 56 | 51.4 | 54 | 1.09 | 1.05 | 10 | 11 | 0.91 | 11.0 | 12 | 0.92 |
| 13 | 38 | 35.8 | 36.9 | 1.06 | 1.03 | 18.5 | 18 | 1.03 | 19.4 | 20 | 0.97 |
| 14 | 34 | 31.2 | 32.4 | 1.09 | 1.04 | 27.7 | 28 | 0.99 | 10.7 | 10 | 1.07 |
| 15 | 28 | 26.9 | 28.5 | 1.04 | 1.06 | 34.7 | 34 | 1.02 | 22.9 | 22 | 1.04 |
| 101 | 30 | 29.4 | 30.6 | 1.02 | 1.04 | 24.5 | 25 | 0.98 | 14.3 | 15 | 0.95 |
| 102 | 56 | 57.7 | 57.7 | 0.97 | 1 | 7.8 | 8 | 0.98 | 9.7 | 10 | 0.97 |
| 103 | 35 | 36.5 | 32.6 | 0.96 | 0.89 | 18.4 | 18 | 1.02 | 14.4 | 15 | 0.96 |
| 104 | 30 | 30.6 | 29.1 | 0.98 | 0.95 | 25.1 | 27 | 0.93 | 12.1 | 12 | 1.01 |

<<Cutting Test>>
(Cutting Evaluation (1): Intermittent Processing Test, Evaluation of Chipping Resistance)

Using the cutting tools of the samples (samples 1 to 15 and samples 101 to 104) fabricated as described above, the number of contacts between each cutting tool and a workpiece until chipping occurred at a cutting edge under the following cutting conditions was measured. Table 4 shows the results. A cutting tool having a larger number of contacts can be evaluated as a cutting tool that is more excellent in chipping resistance. The number of contacts between each cutting tool and the workpiece was measured through the following procedure. After cutting processing was started, the cutting processing was stopped every 30 seconds, and the cutting edge ridge line portion of each cutting tool was observed with a stereoscopic microscope (magnification: 100 times). The same work was repeated until chipping in the cutting edge ridge line portion was confirmed. From an accumulated time required for the cutting processing taken until chipping occurred, the number of contacts to intermittent portions of the workpiece was calculated.

Test Conditions for Intermittent Processing
  Workpiece: SCM415 intermittent material
  Cutting speed: 220 m/min
  Feeding speed: 0.3 mm/rev
  Cutting depth: 2 mm
  Cutting oil: wet (Cutting Evaluation (2): Continuous Processing Test, Evaluation of Wear Resistance)

Using the cutting tools of the samples (samples 1 to 15 and samples 101 to 104) fabricated as described above, an average wear amount in a flank face after cutting was performed for 20 minutes under the following cutting conditions was measured. Table 4 shows the results. A cutting tool having a smaller average wear amount can be evaluated as a cutting tool that is more excellent in wear resistance.

Test Conditions for Continuous Processing
  Workpiece: SCM435 round bar
  Cutting speed: 240 m/min
  Feeding speed: 0.2 mm/rev
  Cutting depth: 2 mm
  Cutting oil: wet (Cutting Evaluation (3): Continuous Processing Test. Evaluation of Peel Resistance of Alumina Layer)

Using the cutting tools of the samples (samples 1 to 15 and samples 101 to 104) fabricated as described above, a cutting time taken until the alumina layer in a rake race was peeled off under the following cutting conditions was measured. Table 4 shows the results. A cutting tool having a longer cutting time can be evaluated as a cutting tool that is more excellent in peel resistance of the alumina layer. The cutting time taken until the alumina layer was peeled off was measured through the following procedure. After cutting processing was started, the cutting processing was stopped every 30 seconds, and the rake face in the vicinity of a cutting edge ridge line portion of each cutting tool was observed with a stereoscopic microscope (magnification: 100 times). The same work was repeated until peeling-off of the alumina layer occurred, and an accumulated time required for the cutting processing taken until peeling-off of the alumina layer occurred was defined as the "cutting time taken until the alumina layer was peeled off" described above.

Test Conditions for Continuous Processing
  Workpiece: S15C round bar
  Cutting speed: 120 m/min
  Feeding speed: 0.25 mm/rev
  Cutting depth: 2 mm
  Cutting oil: wet

TABLE 4

| Sample | Cutting Evaluation (1) Chipping Resistance Number of Contacts (times) | Cutting Evaluation (2) Wear Resistance Wear Amount in Flank Face (mm) | Cutting Evaluation (3) Peel Resistance* Cutting Time (minute) |
| --- | --- | --- | --- |
| 1 | 8242 | 0.15 | 7.5 |
| 2 | 7896 | 0.16 | 8.0 |
| 3 | 8654 | 0.18 | 7.0 |
| 4 | 7224 | 0.14 | 4.0 |
| 5 | 6548 | 0.15 | 4.5 |
| 6 | 6290 | 0.28 | 7.0 |
| 7 | 7468 | 0.27 | 6.5 |
| 8 | 5212 | 0.3 | 3.5 |
| 9 | 6580 | 0.2 | 6.5 |
| 10 | 7032 | 0.19 | 7.0 |
| 11 | 7108 | 0.19 | 6.5 |
| 12 | 6846 | 0.18 | 6.0 |
| 13 | 4876 | 0.19 | 3.5 |
| 14 | 5214 | 0.26 | 6.5 |
| 15 | 5884 | 0.28 | 3.0 |
| 101 | 1278 | 0.22 | 5.0 |
| 102 | 988 | 0.25 | 5.0 |
| 103 | 1042 | 0.27 | 2.0 |
| 104 | 786 | 0.33 | 4.5 |

*peel resistance of the alumina layer

Based on the results in Table 4, the cutting tools of samples 1 to 15 had good results such as the number of contacts of more than 4800 times in cutting evaluation (1). On the other hand, the cutting tools of samples 101 to 104 (the cutting tools of the comparative examples) had the number of contacts of less than 1300 times in cutting evaluation (1). It has been found from the above results that the cutting tools of the examples (the cutting tools having $P_{C1}/P_{C2}$ of more than or equal to 1.03) were more excellent in chipping resistance than the cutting tools of the comparative examples.

Further, based on the results in Table 4, the cutting tools of samples 1 to 5 and 9 to 13 had good results such as a wear amount in the flank face of 0.2 mm or less in cutting evaluation (2). It has been found from this result that, of the cutting tools of the examples, the cutting tools having $P_{O1}/P_{O2}$ of more than or equal to 0.9 and less than 1 were excellent in wear resistance, in addition to chipping resistance described above.

Furthermore, based on the results in Table 4, the cutting tools of samples 1 to 3, 6, 7, 9 to 12, and 14 had good results such as a cutting time of six minutes or more in cutting evaluation (3). It has been found from this result that, of the cutting tools of the examples, the cutting tools having $P_{N1}/P_{N2}$ of more than or equal to 0.9 and less than 1 were excellent in peel resistance in the alumina layer, in addition to chipping resistance.

Although the embodiment and examples of the present invention have been described above, it is also originally intended to combine features of the embodiment and examples described above as appropriate.

It should be understood that the embodiment and examples disclosed herein are illustrative and non-restrictive in every respect. The scope of the present invention is defined by the scope of the claims, rather than the embodiment and examples described above, and is intended to include any modifications within the scope and meaning equivalent to the scope of the claims.

REFERENCE SIGNS LIST

1: rake face; 2: flank face; 3: cutting edge ridge line portion; 10: base material; 20: titanium carbonitride layer; 21: intermediate layer; 22: alumina layer; 23: underlying layer; 24: surface layer; 30: CVD apparatus; 31: base material setting jig; 32: reaction container; 33: temperature adjustment apparatus; 34: gas introduction port; 35: gas introduction pipe; 36: ejection hole; 40: coating layer; 45: coating film; 50: cutting tool; A: point away from an interface between the intermediate layer and the alumina layer by 1 μm on the side of the intermediate layer; $P_A$: virtual plane including point A; $P_B$: interface between the intermediate layer and the alumina layer.

The invention claimed is:

1. A cutting tool comprising a base material and a coating layer provided on the base material,
the coating layer including a titanium carbonitride layer provided on the base material, an intermediate layer provided on the titanium carbonitride layer in contact therewith, and an alumina layer provided on the intermediate layer in contact therewith,
the intermediate layer being composed of a compound made of titanium, carbon, oxygen, and nitrogen,
the intermediate layer having a thickness of more than 1 μm,
when $P_{C1}$ atomic % represents an atomic ratio of the carbon in an interface between the intermediate layer and the alumina layer, and $P_{C2}$ atomic % represents an atomic ratio of the carbon at a point A away from the interface by 1 μm on a side of the intermediate layer, a ratio $P_{C1}/P_{C2}$ of the $P_{C1}$ to the $P_{C2}$ being more than or equal to 1.03 and less than or equal to 1.1.

2. The cutting tool according to claim 1, wherein the $P_{C1}$ is more than or equal to 25 atomic % and less than or equal to 65 atomic %.

3. The cutting tool according to claim 1, wherein, when $P_{N1}$ atomic % represents an atomic ratio of the nitrogen in the interface, and $P_{N2}$ atomic % represents an atomic ratio of the nitrogen at the point A, a ratio $P_{N1}/P_{N2}$ of the $P_{N1}$ to the $P_{N2}$ is more than or equal to 0.9 and less than 1.

4. The cutting tool according to claim 1, wherein, when $P_{O1}$ atomic % represents an atomic ratio of the oxygen in the interface, and $P_{O2}$ atomic % represents an atomic ratio of the oxygen at the point A, a ratio $P_{O1}/P_{O2}$ of the $P_{O1}$ to the $P_{O2}$ is more than or equal to 0.9 and less than 1.

5. The cutting tool according to claim 1, wherein the intermediate layer has a thickness of more than 1 μm and less than or equal to 3 μm.

6. The cutting tool according to claim 1, wherein an underlying layer is further provided between the base material and the coating layer.

7. The cutting tool according to claim 1, wherein a surface layer is further provided on the coating layer.

8. The cutting tool according to claim 1, wherein the $P_{C2}$ is more than or equal to 22 atomic % and less than or equal to 63 atomic %.

9. The cutting tool according to claim 1, wherein when $P_{C3}$ atomic % represents the atomic ratio of the carbon at the point M away from the interface by 0.5 μm on the side of the intermediate layer, a ratio $P_{C3}/P_{C2}$ of the $P_{C3}$ to the $P_{C2}$ is more than or equal to 0.9 and less than or equal to 1.1.

10. The cutting tool according to claim 1, wherein when $P_{C3}$ atomic % represents an atomic ratio of the carbon at a point M away from the interface by 0.5 μm on the side of the intermediate layer, the $P_{C3}$ is more than or equal to the $P_{C2}$ and less than or equal to an average value of the $P_{C1}$ and the $P_{C2}$.

11. The cutting tool according to claim 1, wherein when $P_{N1}$ atomic % represents an atomic ratio of the nitrogen in the interface, the atomic ratio $P_{N1}$ of the nitrogen is more than or equal to 5 atomic % and less than or equal to 35 atomic %.

12. The cutting tool according to claim 1, wherein when $P_{O1}$ atomic % represents an atomic ratio of the oxygen in the interface, the atomic ratio $P_{O1}$ of the oxygen is more than or equal to 5 atomic % and less than or equal to 25 atomic %.

13. The cutting tool according to claim 1, wherein the intermediate layer is made of a carbonitroxide of titanium.

14. The cutting tool according to claim 1, wherein, when PN1 atomic % represents an atomic ratio of the nitrogen in the interface, and PN2 atomic % represents an atomic ratio of the nitrogen at the point A, a ratio PN1/PN2 of the PN1 to the PN2 is more than or equal to 0.9 and less than 1, and
wherein, when PO1 atomic % represents an atomic ratio of the oxygen in the interface, and PO2 atomic % represents an atomic ratio of the oxygen at the point A, a ratio PO1/PO2 of the PO1 to the PO2 is more than or equal to 0.9 and less than 1.

15. The cutting tool according to claim 1, further comprising a surface layer provided directly on the coating layer,
wherein the surface layer includes a compound made of a titanium element and at least one element selected from the group consisting of C, N, and B.

16. The cutting tool according to claim 15, wherein a thickness of the surface layer is between 0.3 μm to 1.5 μm.

* * * * *